United States Patent [19]
Rodgers

[11] 4,446,536
[45] May 1, 1984

[54] COMPLEMENTARY METAL OXIDE SEMICONDUCTORS ADDRESS DRIVE CIRCUIT

[75] Inventor: Richard W. Rodgers, Santa Ana, Calif.

[73] Assignee: McDonnell Douglas Corporation, Long Beach, Calif.

[21] Appl. No.: 390,630

[22] Filed: Jun. 21, 1982

[51] Int. Cl.³ .............................................. G11C 8/00
[52] U.S. Cl. .................................. 365/230; 365/104; 365/185
[58] Field of Search ............... 365/104, 185, 189, 230, 365/181

[56] References Cited
U.S. PATENT DOCUMENTS 4,099,264  7/1978  Lodi ..................................... 365/189
4,144,587  3/1979  Miyakawa et al. ................... 365/104

Primary Examiner—James W. Moffitt
Attorney, Agent, or Firm—Gregory A. Cone; George W. Finch; Donald L. Royer

[57] ABSTRACT

An address drive circuit for use on programmable, non-volatile, semiconductor memories which use either Metal Nitrite Oxide Semiconductor (MNOS) or "floating gate" transistors for Electrically Erasable Programmable Read Only Memory Storage (EEPROMS). The inventive drive circuit is based on the use of prior art high voltage Complementary Metal Oxide Semiconductors (CMOS) transistors which have junction diode breakdown limits exceeding the maximum "device drain voltage" ($V_{DD}$) to be switched. This circuit has negligible direct current power dissipation, high speed memory read/write capability, and requires minimum physical installation area.

12 Claims, 5 Drawing Figures

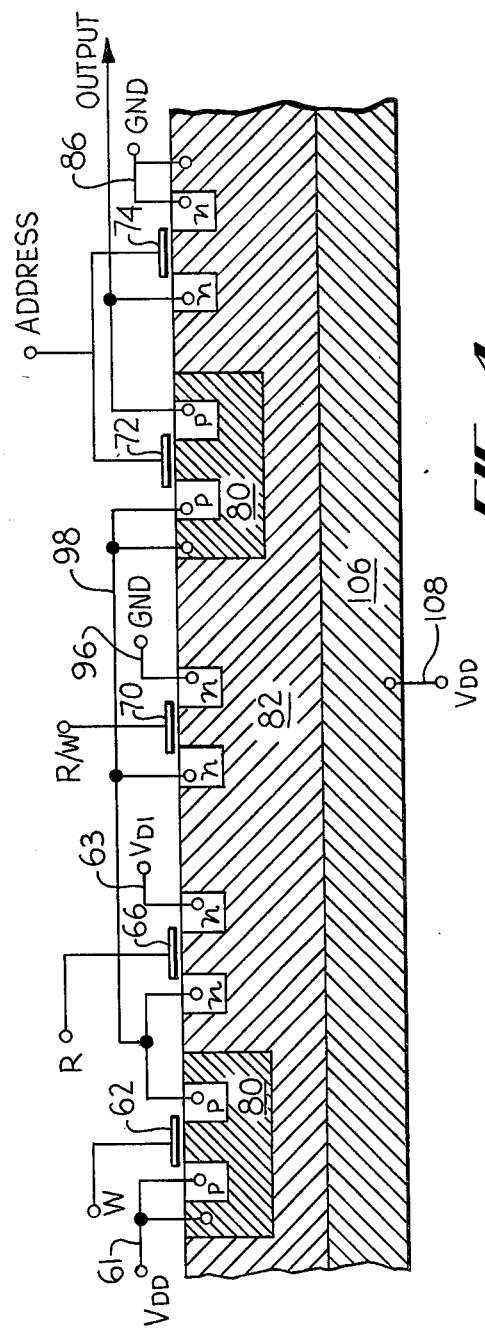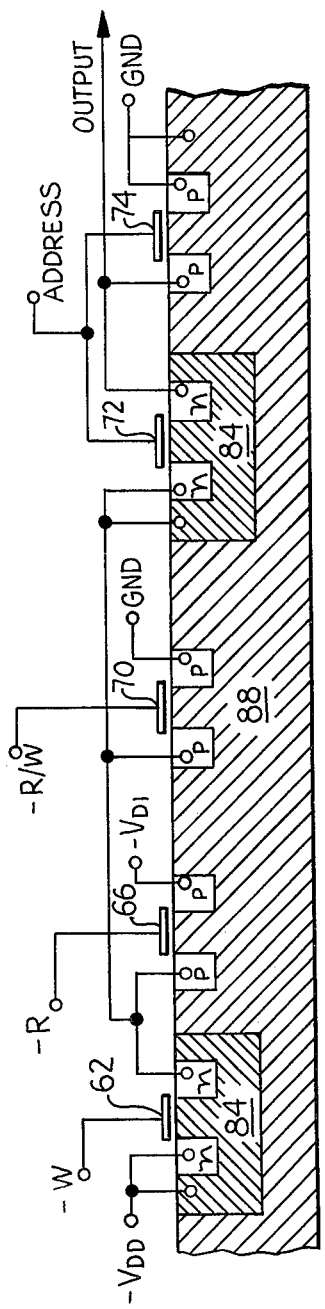

COMPLEMENTARY METAL OXIDE SEMICONDUCTORS ADDRESS DRIVE CIRCUIT

BACKGROUND OF THE INVENTION

This invention relates to drive circuits and more particularly to an address drive circuit for use on electrically programmable, nonvolatile, semiconductor memories.

Electrically Erasable Programmable Read Only Memory Storage (EEPROMS) is accomplished utilizing Metal Nitrite Oxide Semiconductors (MNOS) or "floating gate" transistors for data storage. To address or interrogate the stored data in such memory storage, internal address drive circuits for each word location in storage must be provided. These drive circuits require the capability of switching selectively to one of three supply voltages to provide bias to an array of storage transistors during memory read and write operations and during unselected quiescent conditions. Particularly, during read operations, the selected address drive circuit must output a 5 to 15 volts level to the storage transistors to be read, while the unselected drive circuits provide simultaneously a ground potential. During write operations, the selected address drive circuit must output a full supply level of 20 to 30 volts to the desired storage transistors for periods extending from 1.0 to 100 milliseconds while at the same time the unselected drive circuits provide a ground potential. Finally, during unselected quiescent conditions all drive circuits must output a ground potential.

To achieve this required tristate switching operation, either of two prior art drive circuit designs are commonly used. These designs are known as a static inverter logic gates circuit, which utilizes depletion load transistors, and a "pumped" bootstrap circuit. They have the following common problems:

Both designs have the characteristics of continuously dissipating DC power even when not selected for addressing. In certain applications, this power dissipation becomes a significant portion of the total available memory power since this is a function of the quiescent drive circuit power dissipation multiplied by the number of word locations in memory.

Increased DC power dissipation is experienced in both designs when increasing the speed of the read and write operations. This condition results from the fact that the speed in which a row of storage transistors can be biased for memory read and write operations is a function of the quiescent DC power dissipation of the drive circuits.

Both designs require a relatively large number of transistors/capacitors and control interconnections. As a result, the physical area required by the drive circuits often becomes the limiting factor that determines the practical size of the memory capacity.

It is an object of the present invention to eliminate the virtually steady-state DC power dissipation in the drive circuit.

It is a further object of the invention to increase the speed of memory read and write operations by making the speed of such operations a function of the drive circuit size rather than the DC power dissipation magnitude.

It is still a further object of the present invention to reduce the physical area of the drive circuit while still providing the capability to selectively switch to one of three supply voltages as bias to an array of electrically programmable memory storage transistors, whereby read and write operations can be carried out.

SUMMARY OF THE INVENTION

The present address drive circuit is directed to overcome the deficiencies of excessive power dissipation, limited read/write operation speed, and extensive physical area requirements which are inherent in prior art static inverter logic gate circuits and pumped bootstrap circuits. The inventive circuit is based upon the correct arrangement of prior art high voltage Complementary Metal Oxide Semiconductors (CMOS) transistors having junction diode breakdown limits which exceed the maximum "device drain voltage" ($V_{DD}$) to be switched. A CMOS transistor has a gate, a source, a drain, and a substrate.

The inventive circuit is comprised of two groups of interconnected CMOS transistors. The first group of three transistors forms the control circuit which is common to and serves, by means of a power rail, any number of address drivers. The second group of two transistors forms the address element of the circuit and is provided for each separate address driver feeding any number of memory storage transistors. Two additional CMOS transistors are thus provided for each additional address driver such that a typical address drive circuit having four separate address drivers will be comprised of eleven CMOS transistors, of which three form the control circuit and two form each of the four address drivers.

The three CMOS control circuit transistors are interconnected to each other through the power rail and separately coupled to the read and write signals, to the supply voltages and ground potential. Their combined output is directed to the addressed driver which feeds a row of electrically programmable memory storage transistors. Thus the desired output to the memory storage transistors is provided selectively by setting the control and addressing signals, supply voltages, and ground potential.

BRIEF DESCRIPTION OF THE DRAWINGS

FIG. 4 is a schematic cross-section of the present address drive circuit structure, and FIG. 5 is a schematic cross-section of the present address drive circuit similar to FIG. 4, with the polarity of the supply voltages and signals reversed.

DETAILED DESCRIPTION OF THE INVENTION

Figure 1:
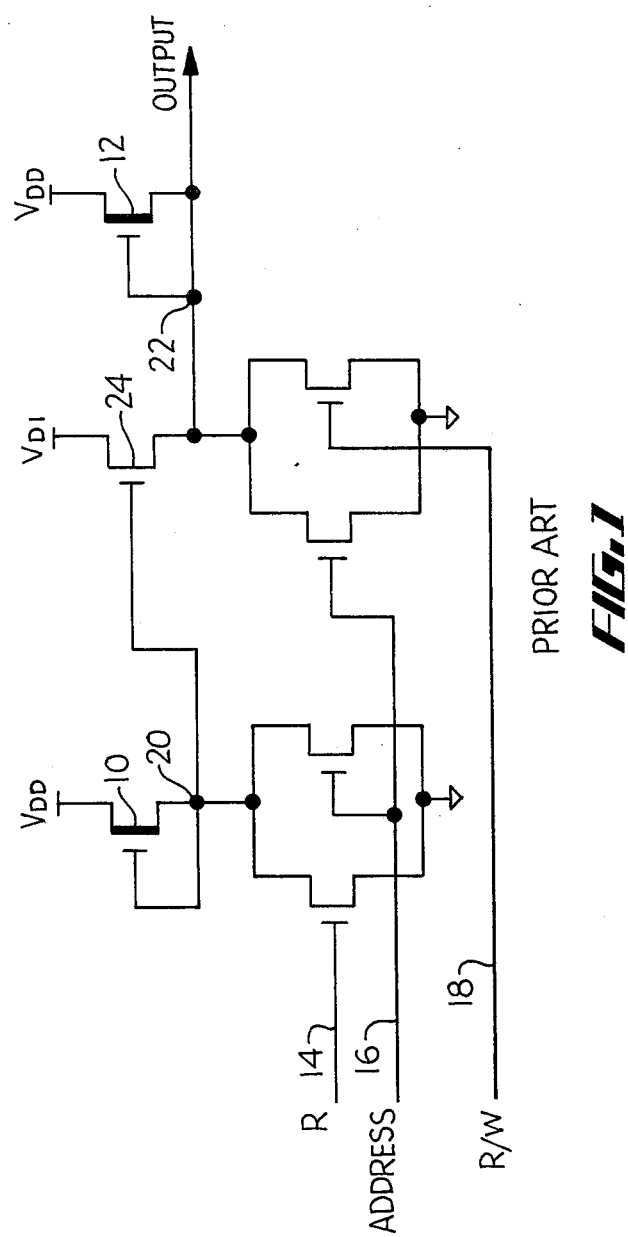
FIG. 1 is a schematic diagram of a prior art address drive circuit using static inverter logic gates which utilize depletion load transistors.

Referring to the drawings, more particularly by reference numerals, FIG. 1 shows a prior art address drive circuit implemented with static logic nor gates that utilize depletion load transistors 10 and 12. During normal unselected quiescent conditions, input control lines 14, 16 and 18 are maintained at a high logic level and the logic gates conduct to pull their respective output nodes 20 and 22 to ground. This results in a 20 to 30 volts $V_{DD}$ power dissipation through depletion load transistors 10 and 12. The amount of the power dissipation is a function of transistors 10 and 24 impedance. During a memory read operation, input control lines 14, 16 and 18 are set to a low logic level causing transistor 10 to turn on transistor 24 which in turn charges a row of storage transistors to a 5 to 15 volts $V_{D1}$ bias voltage level. The speed at which the storage transistors are biased is a function of the output load capacitance and the impedance of transistors 10 and 24. For a write operation, input control line 14 is set at a high logic level while input control lines 16 and 18 are maintained at a low logic level. This results in $V_{DD}$ power dissipation across transistor 10 while transistor 12 charges the storage transistors to a full $V_{DD}$ bias voltage level. The rate of charge is also a function of the load capacitance, as well as the impedance of transistor 12. For memories of 4K to 8K bits storage capacity, the impedance of transistors 10 and 12 in this type of drive circuit must be set within a range of 500K to 800K ohms, if the storage transistors are to be biased during memory read/write operations within reasonable time periods. These impedance levels, in turn, result in a quiescent power dissipation of approximately 1.56 to 2.5 milliwatts per drive circuit. If the storage capacity is increased beyond 8K bits, the quiescent power dissipation of the drive circuit increases proportionally. Moreover, implementation of the seven transistors and the three input control lines used in this drive circuit design requires approximately 31.7 square mils of silicon area based on "six micron design layout rules."

Figure 2:
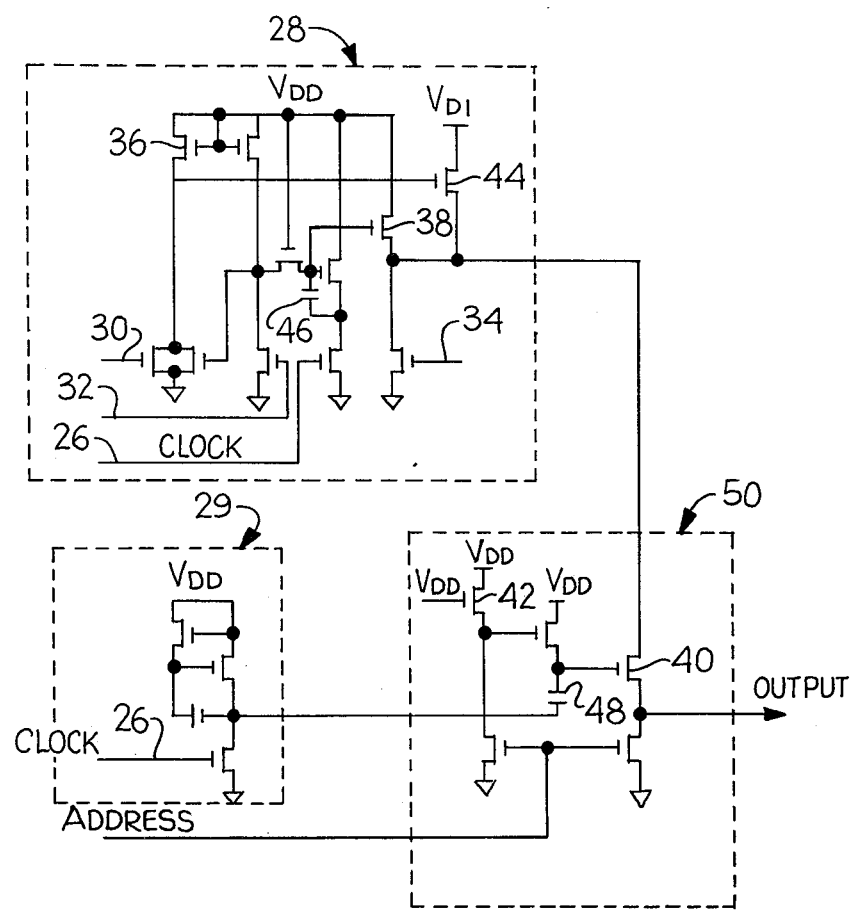
FIG. 2 is a schematic diagram of a prior art pumped bootstrap address drive circuit along with its control logic circuit.

FIG. 2 shows a prior art "pumped" bootstrap address drive circuit consisting of a control logic circuit 28, a refresh driver 29, and one address driver 50 per memory word. Although this drive circuit dissipates less quiescent DC power than the static inverter logic gates circuit referred in FIG. 1, it requires a "refresh" clock signal, and is severely limited to the number of storage transistors which it can bias within reasonable read/write time periods. Still referring to FIG. 2, during normal quiescent conditions, when a driver 50 is not addressed, a 100 Khz clock signal at line 26 is applied continuously to the control logic circuit 28 and input control lines 30, 32 and 34 are set to a high logic level. This condition produces an output ground potential from the control logic circuit 28 and each driver 50. It also results in continuous AC clock power dissipation and DC power dissipation through transistor 36 and 38 in the control logic circuit 28. To bias the storage transistors for a read operation, control line 30 is set at a low logic level along with control line 34 of the control logic circuit 28. This action switches a 5 to 15 volts $V_{D1}$ voltage level to the drivers 50 and the addressed driver outputs this voltage via transistor 40. Unselected drivers output a ground potential and dissipate DC power through transistor 42. For a write operation, input control lines 30, 32 and 34 are set at a low logic level. This causes the gate of transistor 38 in the control circuit to be pumped above the 20 to 30 volts $V_{DD}$ voltage level via capacitor 46 and to output the full $V_{DD}$ voltage value to the drivers 50. The addressed driver 50 in turn switches out the full $V_{DD}$ voltage by means of its driven bootstrap capacitor 48. The unselected drivers output a ground potential and dissipate DC power through transistor 42 during the write operation.

In addition to dissipating AC and DC power, the pumped bootstrap address drive circuit in FIG. 2 has the additional disadvantage that the five transistors and the capacitor per driver occupy a relatively large silicon area. This technique is restricted to minimum storage capacity since the bootstrap action used in the control circuit and drivers becomes ineffective as the load capacitances of the drivers and the storage transistors are increased.

Figure 3:
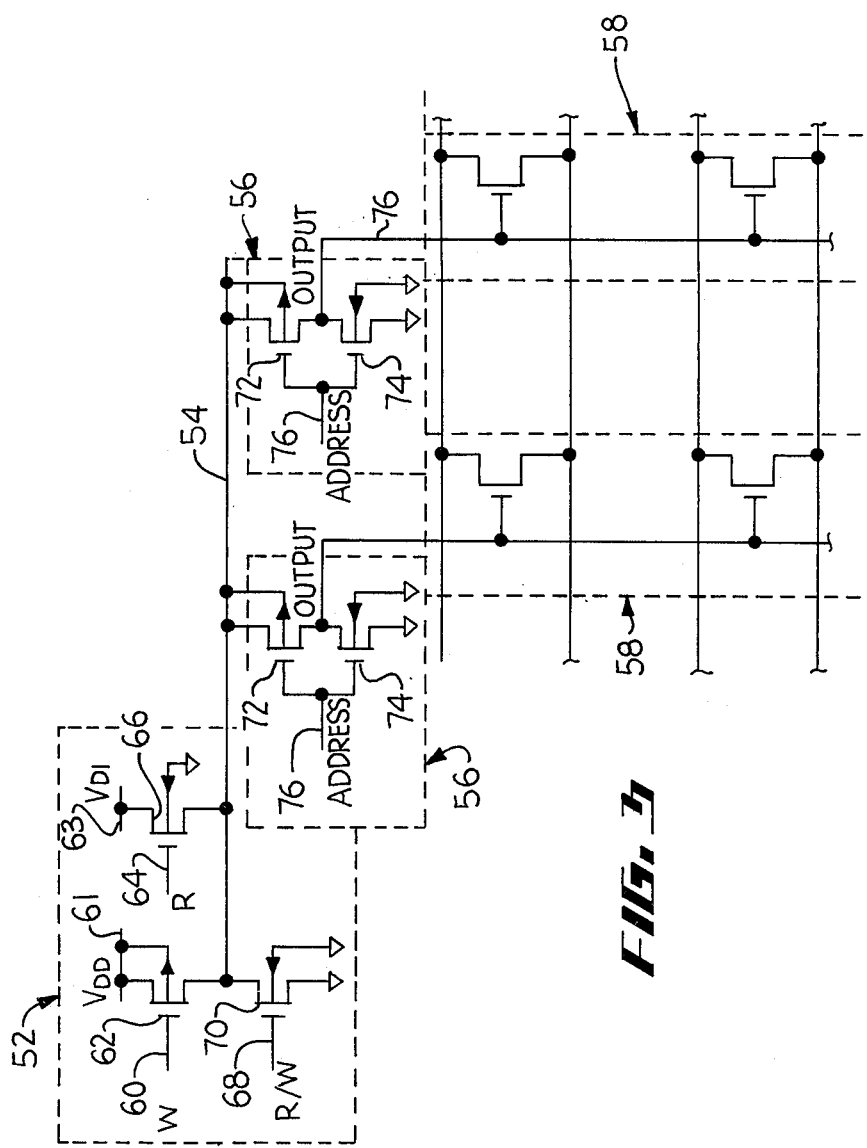
FIG. 3 is a schematic diagram of the present address drive circuit, along with its control circuit.

FIG. 3 shows the present address drive circuit, which includes control circuit 52, supply voltage lines 61 and 63, power rail 54, drivers 56 and electrically programmable memory transistors row 58. The input control lines to the control circuit 52 are set to $V_{DD}$, $V_{D1}$ voltages or ground potential by means of a control signal. The addressing lines to the drivers 56 are set to $V_{DD}$ voltage or ground potential by means of an addressing signal. During unselected quiescent conditions when the memory is not addressed, input control line 60 is set at $V_{DD}$ voltage to reverse bias (cutoff) P-channel transistor 62, and input control line 64 is set at ground potential to cut off N-channel transistor 66. Input control line 68 is set at $V_{DD}$ or $V_{D1}$ voltage, during which conditions, N-channel transistor 70 conducts and brings the power rail 54 to a ground potential. Similarly, the addressing line 76 to each driver 56 is set at $V_{DD}$ voltage whereby P-channel transistor 72 is cut off, and each driver output is brought to a ground potential via N-channel transistor 74, which conducts. Since both transistors 62 and 66 are cut off during this condition, there is no power dissipation in either the drivers or the control circuit.

During a memory read operation, control line 60 is maintained at $V_{DD}$ voltage and control line 68 is set to ground potential. This is followed by control line 64 which is set to $V_{DD}$ voltage, thus causing transistor 66 to conduct and to charge the power rail 54 to the full $V_{D1}$ supply voltage. Concurrently, or following the voltage change on control line 64, the addressing line 76 to a selected driver 56 is set to a ground potential, while the inputs to the unselected drivers 56 are maintained at $V_{DD}$ voltage. This action causes transistor 74 in the selected driver 56 to cut off, and transistor 72 to conduct and charge an entire row of storage transistors 58 to the $V_{D1}$ voltage of the power rail 54. The unselected drivers at this time have their transistors 72 cut off and their transistors 74 conducting to ground potential. Power dissipation during the read operation is limited to transient AC power used in charging the transistors 72 and the capacitive load of a selected row of storage transistors 58. To perform a successive read operation on a different row of storage transistors 58, input control lines 60, 64 and 68 are maintained as described, the previous driver addressing line 76 is switched back to $V_{DD}$ voltage, and the next driver addressing line 76 is set at ground potential. To restore drivers 56 from a read to a quiescent unselected condition, all addressing lines 76 are switched to $V_{DD}$ voltage, control line 64 is set to ground potential, and control line 68 is then switched back to either $V_{DD}$ or $V_{D1}$ voltage.

During a memory write operation, control lines 64 and 68 are set at ground potential, followed by a ground potential applied to control line 60. This action cuts off transistors 66 and 70, and allows transistor 62 to conduct and to charge the power rail 54 and transistor 72 to the full $V_{DD}$ supply voltage. As previously described, the full voltage $V_{DD}$ on the power rail 54 is then switched to a selected row of storage transistors 58 by grounding the addressing line 76 to the selected driver 56, while the input to the remaining drivers 56 are maintained at $V_{DD}$ voltage. Power dissipation during the write condition is limited to AC transient power used in charging the transistor 72 junction capacitance and the capacitance of the selected row of storage transistors 58. A successive write operation is carried out by maintaining the control input conditions and switching $V_{DD}$ voltage to the previous driver addressing line 76, while the next driver addressing line 76 is set to ground potential. The drivers 56 are switched from the write condition to a quiescent unselected state by setting input control line 60 and all driver addressing lines 76 to $V_{DD}$ voltage, and then switching $V_{DD}$ or $V_{D1}$ voltage to input control line 68.

FIG. 4 is a cross-section of the present address drive circuit structure. Although prior art N-well structure 80 on prior art P-type epitaxial layer 82 are diagrammed and discussed for addressing N-channel storage transistors, the basic technique of the present circuit is also applicable to P-well structure 84 on N-type epitaxial layer 88 for address biasing of P-channel storage transistors if polarity of the supply voltages and control signals are appropriately reversed, as shown in FIG. 5.

Still referring to FIG. 4, the address drive circuit utilizes two isolated N-well 80. The first N-well 80, which contains transistor 62, is connected to the line 61 $V_{DD}$ supply voltage and is used in conjunction with transistors 66 and 70 to switch either line 61 $V_{DD}$ voltage, line 63 $V_{D1}$ voltage or line 96 ground potential to power rail 98. The second N-well 80 is connected and driven to the power rail 98 voltage. Although only transistors 72 and 74 are diagrammed, they represent the driver for each word in memory, and this second N-well 80 is common to all driver transistors 72. For isolation of the N diffusions, the P-type epitaxial layer 82 is connected to line 86 ground potential and the junction between layer 82 and N-type wafer substrate 106 is reverse biased by a fixed connection of line 108 $V_{DD}$ voltage to the N-type wafer substrate 106.

Thus, there is shown a preferred embodiment for an address drive circuit which utilizes high voltage complementary metal oxide semiconductors (CMOS) transistors in its control circuit and address element of the inventive circuit. This circuit overcomes deficiencies of prior art address drive circuits. These deficiencies are excessive power dissipation, limited read/write operation speed and physical area requirements. This drive circuit is suitable for any memory or custom logic design that requires selective switching of the full potential value of three or more voltage levels, and the maintenance of each output voltage level for extended time periods.

What is claimed is:

1. An address drive circuit for biasing a row of storage transistors in an electrically programmable memory during memory read and write operations, and during unselected quiescent conditions comprising:

a plurality of drivers, each including first and second transistors having a gate, a source, a drain and substrate, each said driver including an addressing terminal commonly connected to the gates of said first and second transistors for receiving an addressing signal, the drain of said second transistor and the source of said first transistor commonly connected to the gates of a plurality of said storage transistors, and the drain and substrate of said first transistor connected to a ground voltage;

control means for providing an output voltage to said drivers, said control means having third, fourth and fifth transistors, each of said transistors having a gate, a source, a drain, and a substrate, said control means having an input control line connected to the gates of each said transistors to receive a first, second and third control signals respectively concurrently applied thereto, having the source and substrate of said fourth transistor coupled to a first supply voltage, having the source of said fifth transistor coupled to a second supply voltage, and having the drain and substrate of said third transistor and the substrate of said fifth transistor coupled to the ground potential; and means for interconnecting the source and substrate of said second transistor of each said drivers with the source and substrate of said third transistor and the drains of said fourth and fifth transistors.

2. An address drive circuit as recited in claim 1 wherein the first supply voltage is the Device Drain Voltage ($V_{DD}$) and the second supply voltage is less in magnitude than the first supply voltage.

3. An address drive circuit as recited in claim 2, wherein said first, second, third, fourth, and fifth transistors are high voltage complementary metal oxide semiconductors (CMOS) transistors with junction diode breakdown limits exceeding the Device Drain Voltage ($V_{DD}$).

4. An address drive circuit as recited in claim 3, wherein said interconnecting means is a power rail.

5. An address drive circuit as recited in claim 4, wherein said first transistor is an N-channel transistor formed in a P-type epitaxial layer grown in an N-type wafer substrate, said fourth transistor is a P-channel transistor formed in a first N-well structure formed in said epitaxial layer, said third transistor is an N-channel transistor formed in said epitaxial layer, said second transistor is a P-channel transistor formed in a second N-well structure formed in said epitaxial layer, and said fifth transistor is an N-channel transistor formed in said epitaxial layer; and wherein said wafer substrate and said first N-well structure are charged to the first supply voltage, said second N-well structure is charged to the power rail voltage and said epitaxial layer is charged to the ground potential.

6. An address drive circuit as recited in claim 5, wherein the first control signal is equal to the second supply voltage, the second control signal is equal to the first supply voltage, and the third control signal is equal to the ground potential; and wherein said control signals are applied, during memory unselected quiescent conditions, to the input control lines of said third, fourth and fifth transistors, respectively, so as to render nonconductive said fourth and fifth transistors and to render conductive said third transistor, charging the source of said third transistor and said power rail to ground potential.

7. An address drive circuit as recited in claim 5, wherein the first control input signal is equal to the ground potential, the second control input signal is equal to the first supply voltage, and the third control input signal is equal to the first supply voltage; and wherein said control input signals are applied, during a memory read operation, to the input control lines of said third, fourth and fifth transistors, respectively, so as to render nonconductive said third and fourth transistors and to render conductive said fifth transistor, charging the drain of said fifth transistor and said power rail to the second supply voltage.

8. An address drive circuit as recited in claim 5, wherein the first, second and third control signals are equal to the ground potential; and wherein said control signals are applied, during a memory write operation, to the input control lines, of said third, fourth and fifth transistors, respectively, so as to render nonconductive said fourth transistors and to render conductive said fourth transistor, charging the drain of said fourth transistor and said power rail to the first supply voltage.

9. An address drive circuit as recited in claim 6, wherein the voltage of said power rail is applied to the source and substrate of said second transistor, an addressing signal equal to the first supply voltage is applied concurrently to the control signals, to the addressing line of said drivers so that said second transistor is rendered nonconductive and said first transistor is rendered conductive, charging the source of said first transistor, the drain of said second transistor and the gates of all said storage transistors to the ground potential.

10. An address drive circuit as recited in claim 7, wherein the voltage of said power rail is applied to the source and substrate of said second transistor, an addressing signal equal to the ground potential is applied, concurrently to the control signals, to the addressing line of the addressed driver so that said second transistor is rendered conductive and said first transistor is rendered nonconductive, charging the source of said first transistor, the drain of said second transistor and the gates of the connected row of said storage transistors to the second supply voltage.

11. An address drive circuit as recited in claim 8, wherein the voltage of said power rail is applied to the source and substrate of said second transistor, an addressing input signal equal to the ground potential is applied, concurrently to said control input signals, to the addressing line of the addressed driver, so that said second transistor is rendered conductive and said first transistor is rendered nonconductive, charging the source of said first transistor, the drain of said second transistor and the gates of the connected row of said storage transistors to the first supply voltage.

12. An address drive circuit as recited in claim 4, wherein said first transistor is a P-channel transistor formed in an N-type epitaxial layer grown in a P-type wafer substrate, said fourth transistor is an N-channel transistor formed in a first P-well structure formed in said epitaxial layer, said third transistor is a P-channel transistor formed in said epitaxial layer, said second transistor is an N-channel transistor formed in a second N-well structure formed in said epitaxial layer, and said fifth transistor is a P-channel transistor formed in said epitaxial layer; wherein said wafer substrate and said first P-well structure are charged to the first supply voltage, said second P-well structure is charged to the power rail voltage and said epitaxial layer is charged to the ground potential.

* * * * *